(12) United States Patent
Andou

(10) Patent No.: US 10,791,636 B2
(45) Date of Patent: Sep. 29, 2020

(54) METHOD FOR MANUFACTURING DISPLAY DEVICE AND DISPLAY DEVICE

(71) Applicant: Japan Display Inc., Minato-ku (JP)

(72) Inventor: Naohisa Andou, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 213 days.

(21) Appl. No.: 15/646,233

(22) Filed: Jul. 11, 2017

(65) Prior Publication Data

US 2018/0027673 A1    Jan. 25, 2018

(30) Foreign Application Priority Data

Jul. 21, 2016 (JP) ................... 2016-143261

(51) Int. Cl.
*H05K 5/00* (2006.01)
*H01L 27/32* (2006.01)
(Continued)

(52) U.S. Cl.
CPC ....... *H05K 5/0017* (2013.01); *G02F 1/13452* (2013.01); *H01L 27/3276* (2013.01);
(Continued)

(58) Field of Classification Search
CPC .. H05K 5/0017; H05K 13/0015; H05K 1/028; H05K 1/0269; H05K 13/0069; H05K 3/46; H05K 2203/166; H05K 2201/056; G02F 1/1333; H01L 27/3276; H01L 51/0097; H01L 51/5237; H01L 51/56; H01L 2251/5338; Y02E 10/549; Y10T 428/10
See application file for complete search history.

(56) References Cited

U.S. PATENT DOCUMENTS

2008/0106874 A1    5/2008 Okuda
2008/0169063 A1*   7/2008 Fang ................ G02F 1/133305
                                                 156/299
(Continued)

FOREIGN PATENT DOCUMENTS

JP    2007-27222      2/2007
JP    2008-116695 A   5/2008

OTHER PUBLICATIONS

Japanese Office Action of Jun. 2, 2020, with computer generated English translation, in corresponding Japanese Patent Application No. 2016-143261, citing documents AA-AC and AO therein (6 pages).

*Primary Examiner* — Anthony J Frost
(74) *Attorney, Agent, or Firm* — Oblon, McClelland, Maier & Neustadt, L.L.P.

(57) ABSTRACT

A method for manufacturing a display device includes preparing a flexible substrate that includes an alignment mark in a frame area, preparing a spacer that includes a notch or a hole penetrating from a back surface side to a display surface side of the spacer, disposing the spacer on a back surface side of the flexible substrate, and bending the bent area of the flexible substrate to conform to a shape of the spacer and disposing the terminal area of the flexible substrate on the back surface side of the spacer. In the step of disposing the spacer, the alignment mark is read through the notch or the hole from the back surface side of the flexible substrate so as to position the spacer on the flexible substrate.

5 Claims, 12 Drawing Sheets

(51) Int. Cl.
*G02F 1/1345* (2006.01)
*H01L 51/00* (2006.01)
*H01L 51/52* (2006.01)
*H01L 51/56* (2006.01)
*H05K 1/02* (2006.01)
*H05K 3/46* (2006.01)
*H05K 13/00* (2006.01)
*G02F 1/1333* (2006.01)

(52) U.S. Cl.
CPC ...... *H01L 51/0097* (2013.01); *H01L 51/5237* (2013.01); *H01L 51/56* (2013.01); *H05K 1/028* (2013.01); *H05K 1/0269* (2013.01); *H05K 3/46* (2013.01); *H05K 13/0015* (2013.01); *H05K 13/0069* (2013.01); *G02F 1/133305* (2013.01); *H01L 2251/5338* (2013.01); *H05K 2201/056* (2013.01); *H05K 2203/166* (2013.01); *Y02E 10/549* (2013.01); *Y10T 428/10* (2015.01)

(56) References Cited

U.S. PATENT DOCUMENTS

| | | | |
|---|---|---|---|
| 2014/0183473 A1* | 7/2014 | Lee | H01L 51/0097 257/40 |
| 2014/0217382 A1 | 8/2014 | Kwon et al. | |
| 2015/0062525 A1* | 3/2015 | Hirakata | G02F 1/133305 349/158 |
| 2016/0064466 A1 | 3/2016 | Son et al. | |

* cited by examiner

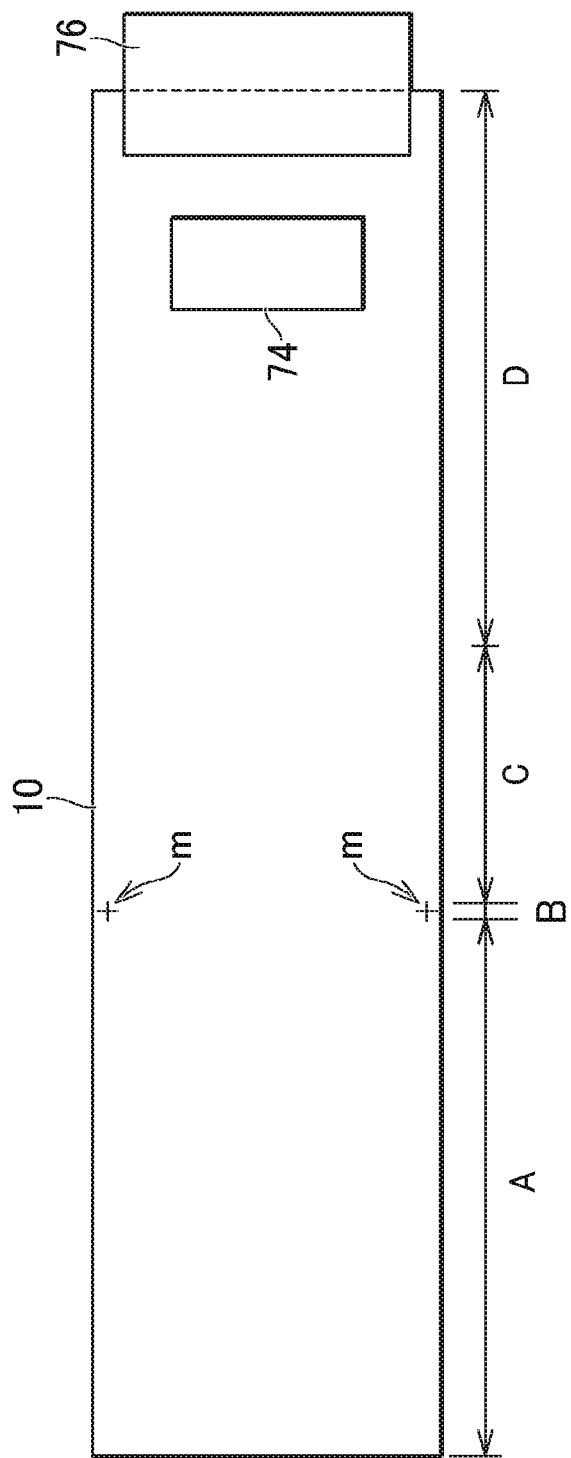

METHOD FOR MANUFACTURING DISPLAY DEVICE AND DISPLAY DEVICE

CROSS-REFERENCE TO RELATED APPLICATION

The present application claims priority from Japanese application JP2016-143261 filed on Jul. 21, 2016, the content of which is hereby incorporated by reference into this application.

BACKGROUND OF THE INVENTION

1. Field of the Invention

The present invention relates to a display device and a method for manufacturing the display device.

2. Description of the Related Art

There has been an increasing need for narrowing a so-called frame area, which is on the periphery of a display area for displaying an image, so as to downsize a display device or expand the display area. In particular, demand for a narrower frame has been increasing in mobile devices, such as smartphones.

As such, narrowing a frame with the use of a flexible substrate and folding an area outside the display area toward the back side of the display area have been considered. The area outside the display area includes wirings and circuits. When the flexible substrate is bent, wiring disconnection or damage may occur due to bending stress on the bent part. In this regard, for example, JP2007-027222A discloses that a restriction film prevents wiring disconnection.

In the case where the flexible substrate is bent toward the back side of the display area, as disclosed in JP2007-27222A, it is necessary to accurately determine the range of the bending. This is because narrowing a frame is impossible if the area bent toward the back side of the flexible substrate is small. Further, inaccurate bending may cause destruction of the display device.

SUMMARY OF THE INVENTION

One or more embodiments of the present invention have been conceived in view of the above, and an object thereof is to provide a display device and a method for manufacturing the display device for accurately narrowing a frame.

A method for manufacturing a display device according to an aspect of the present invention includes preparing a flexible substrate on which a display area displaying an image, a frame area including an alignment mark, a bent area, and a terminal area provided with a terminal are provided in this order, preparing a spacer that includes a notch or a hole penetrating from a back surface side to a display surface side of the spacer, disposing the spacer on a back surface side of the flexible substrate, and bending the bent area to conform to a shape of the spacer and disposing the terminal area on the back surface side of the spacer. In the step of disposing the spacer, the alignment mark is read through the notch or the hole from the back surface side of the flexible substrate so as to position the spacer on the flexible substrate.

A display device according to another aspect of the present invention includes a spacer and a flexible substrate that includes a display area for displaying an image, a frame area in a periphery of the display area, a bent area disposed outside the frame area and curved to conform to a shape of the spacer, and a terminal area disposed on a back surface side of the spacer through the bent area and provided with a terminal. The flexible substrate includes an alignment mark in the frame area, and the spacer includes a notch or a hole at a position corresponding to the alignment mark, the notch or the hole penetrating from a back surface side to a display surface side of the spacer.

BRIEF DESCRIPTION OF THE DRAWINGS

FIG. 5 is a plan view of the flexible substrate in a developed state viewed from the display side.

DETAILED DESCRIPTION OF THE INVENTION

Embodiments of the present invention will be described below in detail with reference to the accompanying drawings.

In the present embodiment, when a manner in which a structure is disposed "on" another structure is described, it is understood, if not otherwise stated, that simply describing "on" includes both a case in which the structure is disposed directly on the another structure in contact with each other and a case in which the structure is disposed above or over the another structure with a third structure interposed therebetween.

Figure 1:
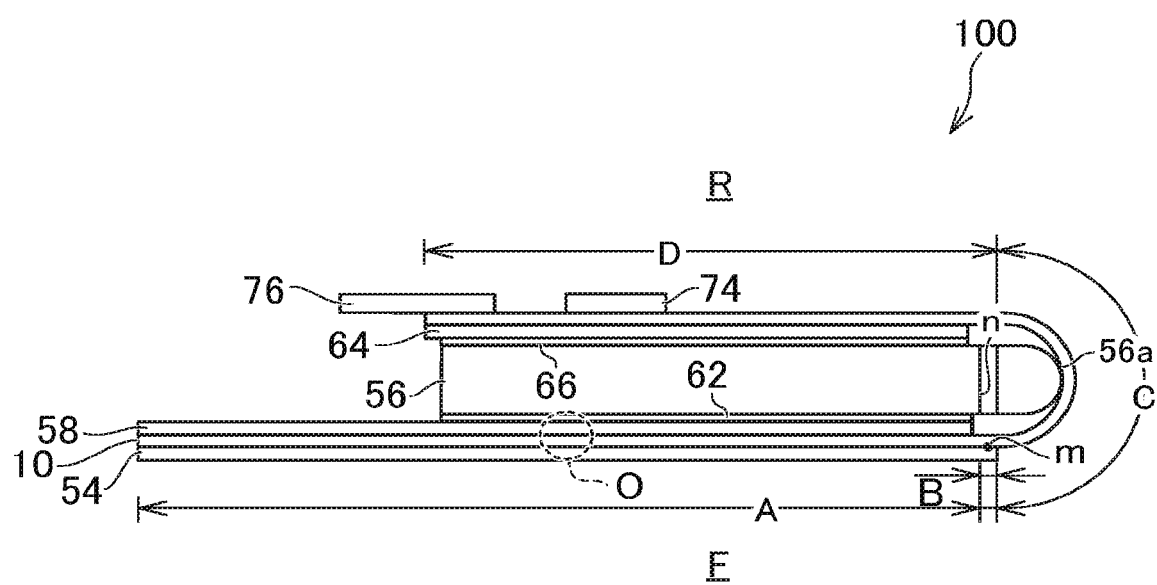
FIG. 1 is an overall schematic side view of a display device according to the present embodiment.

FIG. 1 is an overall schematic side view of the display device according to the present embodiment. In the following description, in a display area A of a flexible substrate 10, a side on which an image is displayed (the bottom part of FIG. 1 etc.) is defined as a display surface side F, and a side opposite to the display surface side F (the upper part of FIG. 1 etc.) is defined as a back surface side R.

In this embodiment, an organic electroluminescence display device will be used as an example of a display device 100, although any display device, such as a liquid crystal display device, using the flexible substrate 10 may be used. The display device 100 combines unit pixels SP (sub-pixel) in multi-colors of red, green, and blue to form full-color pixels P (pixel), and displays a full-color image (see FIG. 8).

Figure 2:
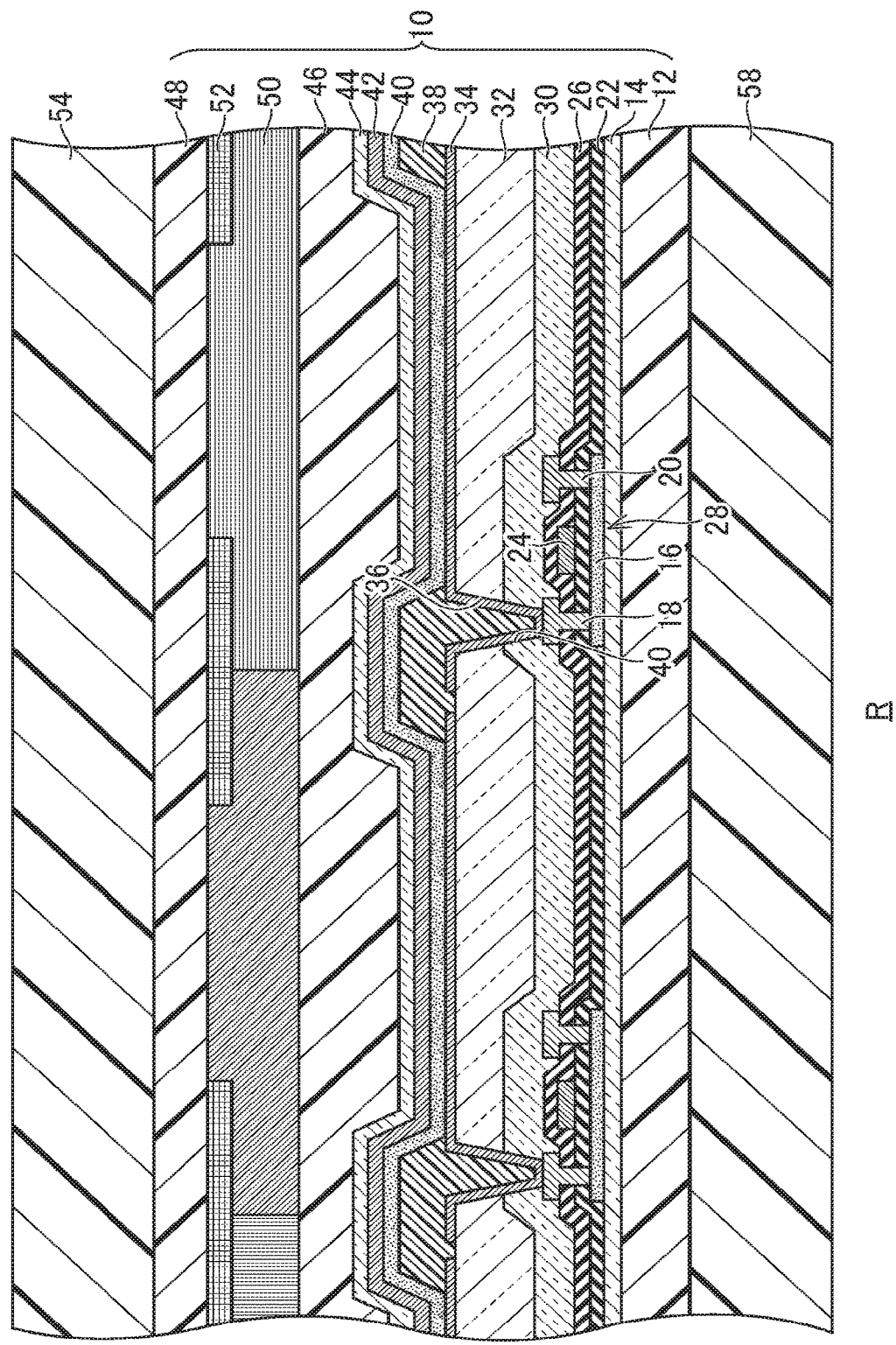
FIG. 2 is an enlarged cross-sectional view of a part encompassed by a dashed circle O in FIG. 1.
Figure 8:
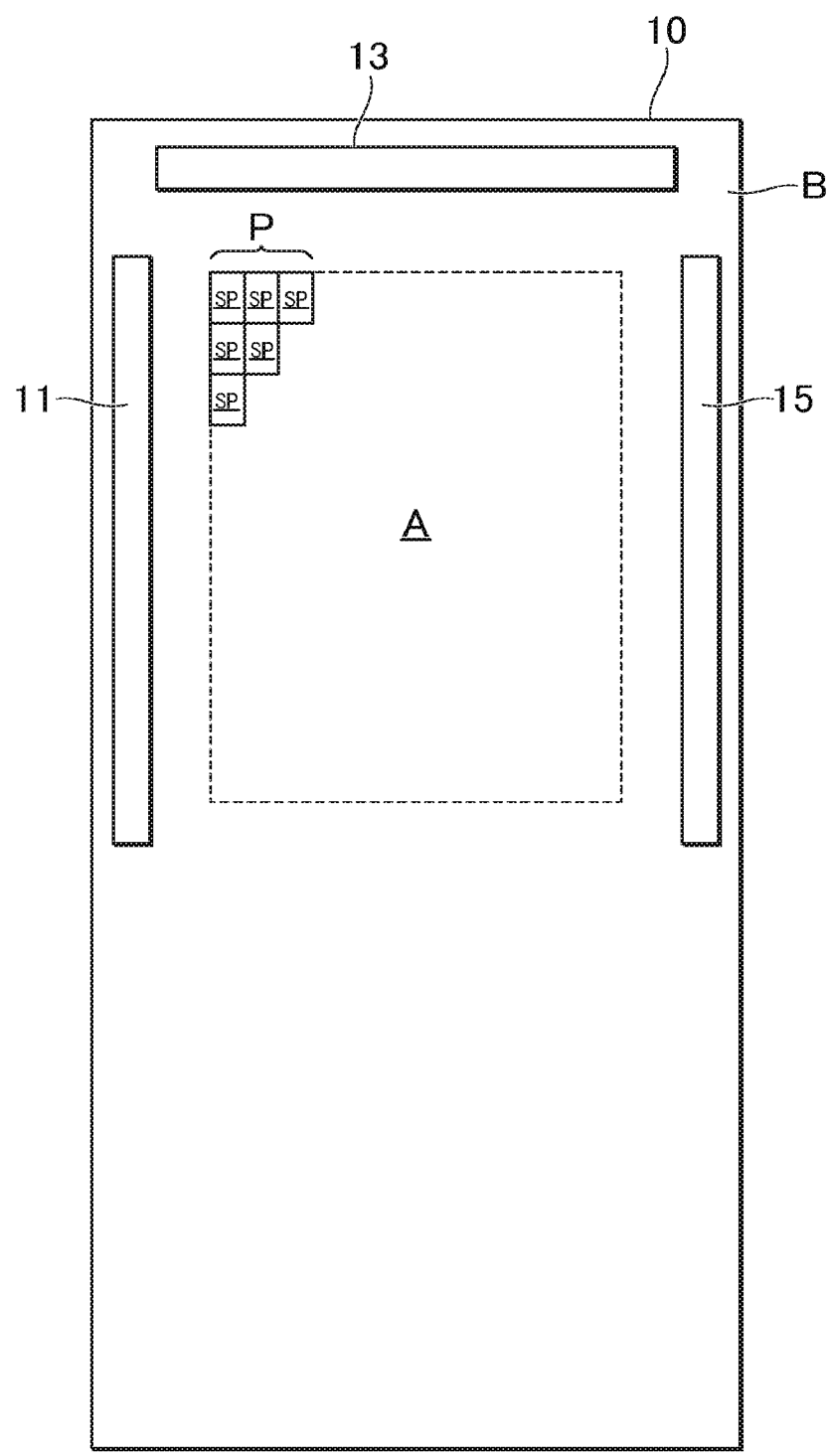
FIG. 8 is a plan view of the flexible substrate in a developed state showing a pixel arrangement and peripheral circuits.

As shown in FIG. 1, the display device 100 includes a transparent flexible substrate 10. In the following, referring to FIG. 2, details of the configuration of the flexible substrate 10 will be described. FIG. 2 is an enlarged cross-sectional view of a part encompassed by a dashed circle O in FIG. 1. Unlike the other drawings, FIG. 2 indicates the upper part of the drawing as the display surface side F, and the bottom part of the drawing as the back surface side R. FIG. 8 is a plan view of the flexible substrate in a developed state showing a pixel arrangement and peripheral circuits. As shown in FIG. 8, the pixels P arranged in a matrix are disposed in the display area A of the flexible substrate 10, and the peripheral circuits 11, 13, and 15 are disposed in a frame area B described later. FIG. 8 illustrates only some of the pixels P, although the pixels P are disposed in substantially the entire display area A. Although not shown, wirings such as gate lines and signal lines extend from the peripheral circuits 11, 13, and 15 toward the display area A. The signal lines extend from an integrated circuit chip 74 to the respective pixels P.

As shown in FIG. 2, the flexible substrate 10 includes a first substrate 12 formed of a resin. An undercoat 14 is formed on the first substrate 12 in order to serve as a barrier to impurities contained in the first substrate 12, and a semiconductor layer 16 is formed on the undercoat 14. A source electrode 18 and a drain electrode 20 are electrically connected to the semiconductor layer 16, and a gate insulating film 22 is formed so as to cover the semiconductor layer 16. A gate electrode 24 is formed on the gate insulating film 22, and an insulating interlayer 26 is formed so as to cover the gate electrode 24. The source electrode 18 and the drain electrode 20 penetrate the gate insulating film 22 and the insulating interlayer 26. The semiconductor layer 16, the source electrode 18, the drain electrode 20, and the gate electrode 24 form a thin-film transistor 28. The passivation film 30 is disposed so as to cover the thin-film transistor 28.

A flattening layer 32 is disposed on the passivation film 30. A plurality of pixel electrodes 34 (e.g., anodes) are disposed on the flattening layer 32 so as to correspond to respective unit pixels SP. The flattening layer 32 is formed such that at least a surface on which the pixel electrode 34 is disposed is flat. The pixel electrode 34 is electrically connected to one of the source electrode 18 and the drain electrode 20 on the semiconductor layer 16 through a contact hole 36 penetrating the flattening layer 32 and the passivation film 30.

An insulating layer 38 is formed on the flattening layer 32 and the pixel electrode 34. The insulating layer 38 is formed on the perimeter of the pixel electrode 34 so as to make an opening on a part (e.g., the center) of the pixel electrode 34. The insulating layer 38 forms a bank that surrounds a part of the pixel electrode 34.

A light emitting element layer 40 is disposed on the pixel electrode 34. The light emitting element layer 40 is continuously disposed over a plurality of pixel electrodes 34, and also disposed over the insulating layer 38. A light emitting element layer 40 may be provided to each (separated) pixel electrode 34. In this case, the light emitting element layers 40 emit light in blue, red, and green colors corresponding to respective pixels. This eliminates a need for providing a color filter described later. The light emitting element layer 40 includes at least a light emitting layer, and may further include at least one of an electron transport layer, a hole transport layer, an electron injection layer, and a hole injection layer.

A common electrode 42 (e.g., cathode) is provided on the light emitting element layer 40 such that the common electrode 42 is in contact with the light emitting element layer 40 on the plurality of pixel electrodes 34. The common electrode 42 is formed so as to be disposed on the insulating layer 38, which is a bank. The light emitting element layer 40 is disposed between the pixel electrode 34 and the common electrode 42, controlled in brightness by an electric current that flows between them, and emits light.

The light emitting element layer 40 is covered by a sealing layer 44 laminated on the common electrode 42, and is thus sealed and protected from moisture. A second substrate 48 is provided on the sealing layer 44 through a filler layer 46. The second substrate 48 has colored layers 50 in a plurality of colors (e.g., blue, red, green), and a black matrix 52 formed of metal or resin is disposed between two adjacent colored layers 50 in different colors to serve as a color filter. The second substrate 48 may be a touch panel, or include a polarizing plate or a retardation plate.

Figure 3:
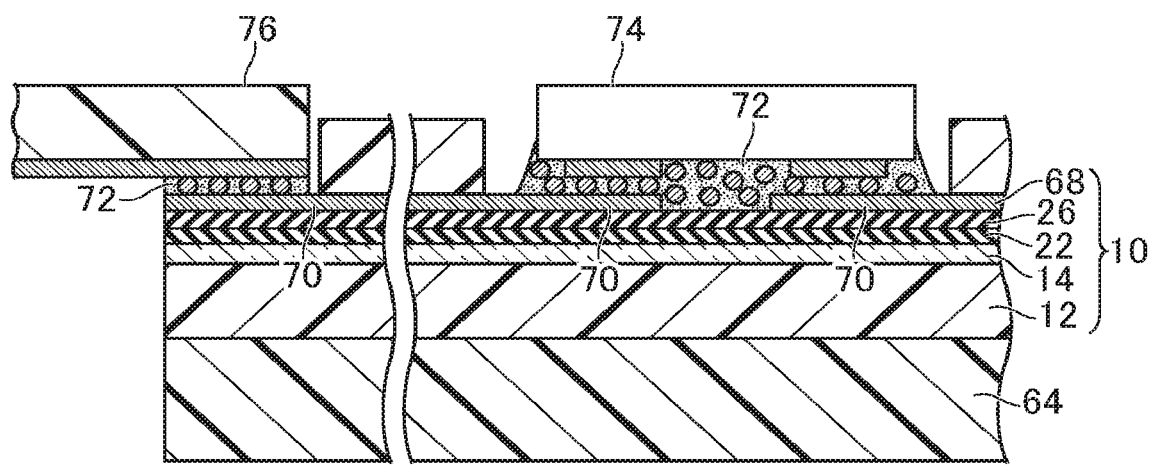
FIG. 3 is an enlarged cross-sectional view of the vicinity of an edge of a terminal area of a flexible substrate.

FIG. 3 is an enlarged cross-sectional view of the vicinity of an edge of a terminal area D (see FIG. 1) of the flexible substrate 10. A wiring 68 is provided in the terminal area D. The wiring 68 extends from the display area A to the edge of the terminal area D through the frame area B and a bent area C. The wiring 68 is formed in the same layer as, for example, the source electrode 18 and the drain electrode 20. The wiring 68 includes terminals 70. The terminals 70 are electrically connected to the integrated circuit chip 74 and a flexible printed circuit (FPC) substrate 76 through an anisotropic conductive film 72. The integrated circuit chip 74 may be disposed on and electrically connected to the FPC substrate 76.

Figure 4:
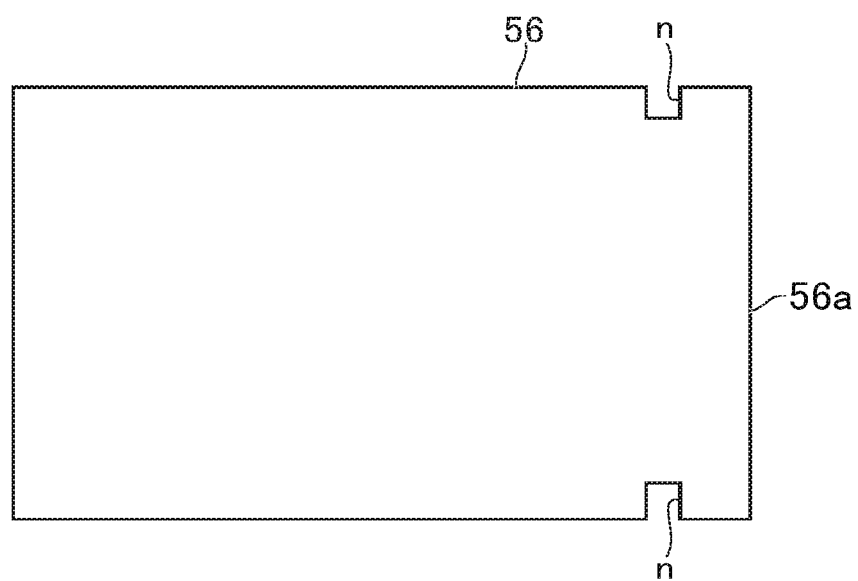
FIG. 4 is a plan view of a spacer viewed from the back.

Referring to FIGS. 1, 4, and 5, an overall configuration of the display device 100 will be described. FIG. 4 is a plan view of a spacer viewed from the back. FIG. 5 is a plan view of the flexible substrate in a developed state viewed from the display side.

As shown in FIG. 1, the display device 100 includes the spacers 56, a surface reinforcing film 54, back reinforcing films 58 and 64, the integrated circuit chip 74, and the FPC substrate 76, in addition to the flexible substrate 10. The surface reinforcing film 54 and the back reinforcing films 58 and 64 are provided so as to reinforce and protect the flexible substrate 10. The spacers 56 are provided to guide the bend of the flexible substrate 10.

The flexible substrate 10 includes the display area A for displaying an image, the frame area B on the perimeter of the display area A, the bent area C outside the frame area B, and the terminal area D closer to the back surface side R than the spacers 56 through the bent area C. The display area A and the frame area B are placed closer to the display surface side F than the spacers 56. The bent area C is formed in a bent shape so as to conform to the shapes of the spacers 56. In this embodiment, for simplicity, the frame area B is only provided between the display area A and the bent area C, although in actuality the frame area B surrounds four sides of the display area A in a plan view.

The display surface side F of the frame area B includes alignment mark m that serve as a guide when the spacers 56 is positioned on the back reinforcing film 58. As shown in FIG. 5, a pair of alignment marks m are provided to oppose to each other in the width direction of the flexible substrate 10.

As shown in FIG. 1, the surface reinforcing film 54 is disposed on the display surface side F of the flexible substrate 10 in the display area A and the frame area B so as not to overlap the bent area C.

As shown in FIG. 1, the back reinforcing film 58 is disposed on the back surface side R of the flexible substrate 10 in the display area A. The back reinforcing film 64 is disposed on the display surface side F of the flexible substrate 10 in the terminal area D. In other words, the back reinforcing films 58 and 64 are disposed inside of the bend of the flexible substrate 10. In this embodiment, the back reinforcing films 58 and 64 are completely separated from each other, but not limited to this. The back reinforcing films 58 and 64 may be partially connected, and the connected part may be curved to conform to the bent area C of the flexible substrate 10.

As shown in FIG. 1, the back reinforcing film 64 is affixed to the surface of the back surface side R of the spacer 56 by the adhesive member 66, and the back reinforcing film 58 is affixed to the surface of the display surface side F of the spacer 56 by the adhesive member 62. The adhesive member 62 and the adhesive member 66 may be made of adhesive resin, for example, or a double-sided tape.

As shown in FIG. 1, the spacer 56 is shaped such that a guide section 56a in contact with the bent area C of the flexible substrate 10 is curled in a side view. Such a shape prevents wiring disconnection or damage of the wiring 68 in the bent area C of the flexible substrate 10. As shown in FIG. 4, the spacer 56 is substantially rectangular in a plan view, and includes a pair of notches n opposing to each other in the width direction of the spacer 56. As shown in FIG. 1, the notch n is provided on a position corresponding to the alignment mark m on the flexible substrate 10 so as to penetrate from the back surface side R to the display surface side F.

Figure 6A:
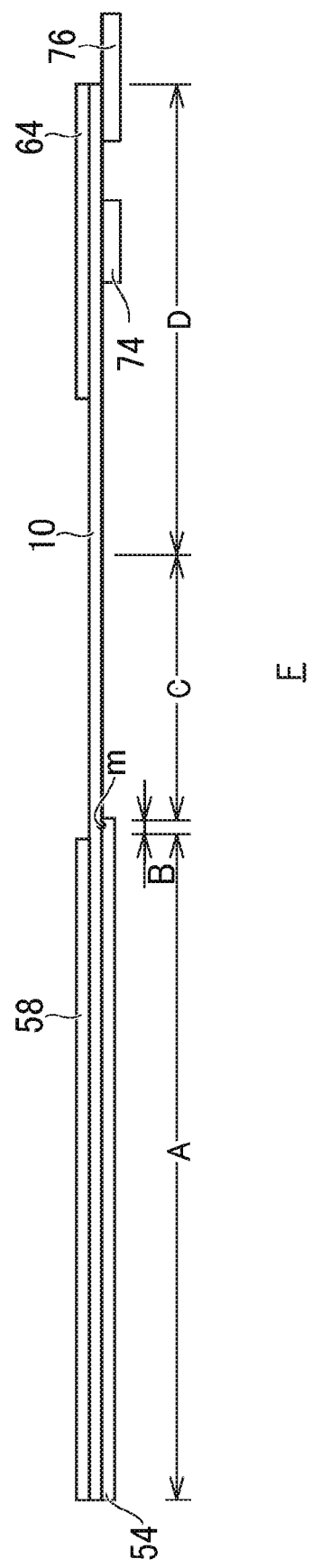
FIG. 6A is a side view of the flexible substrate in a developed state.
Figure 6B:
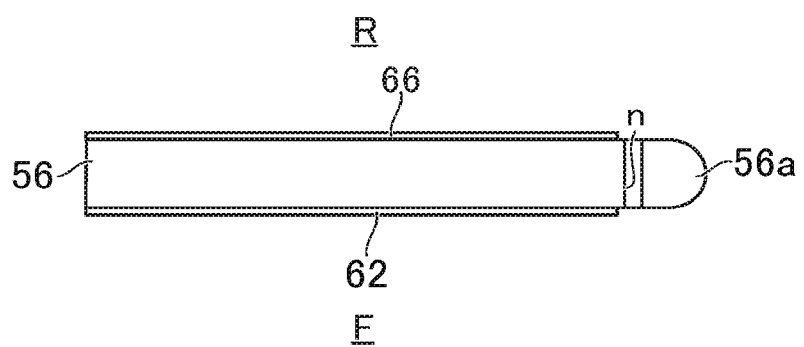
FIG. 6B is a side view of the spacer.
Figure 6C:
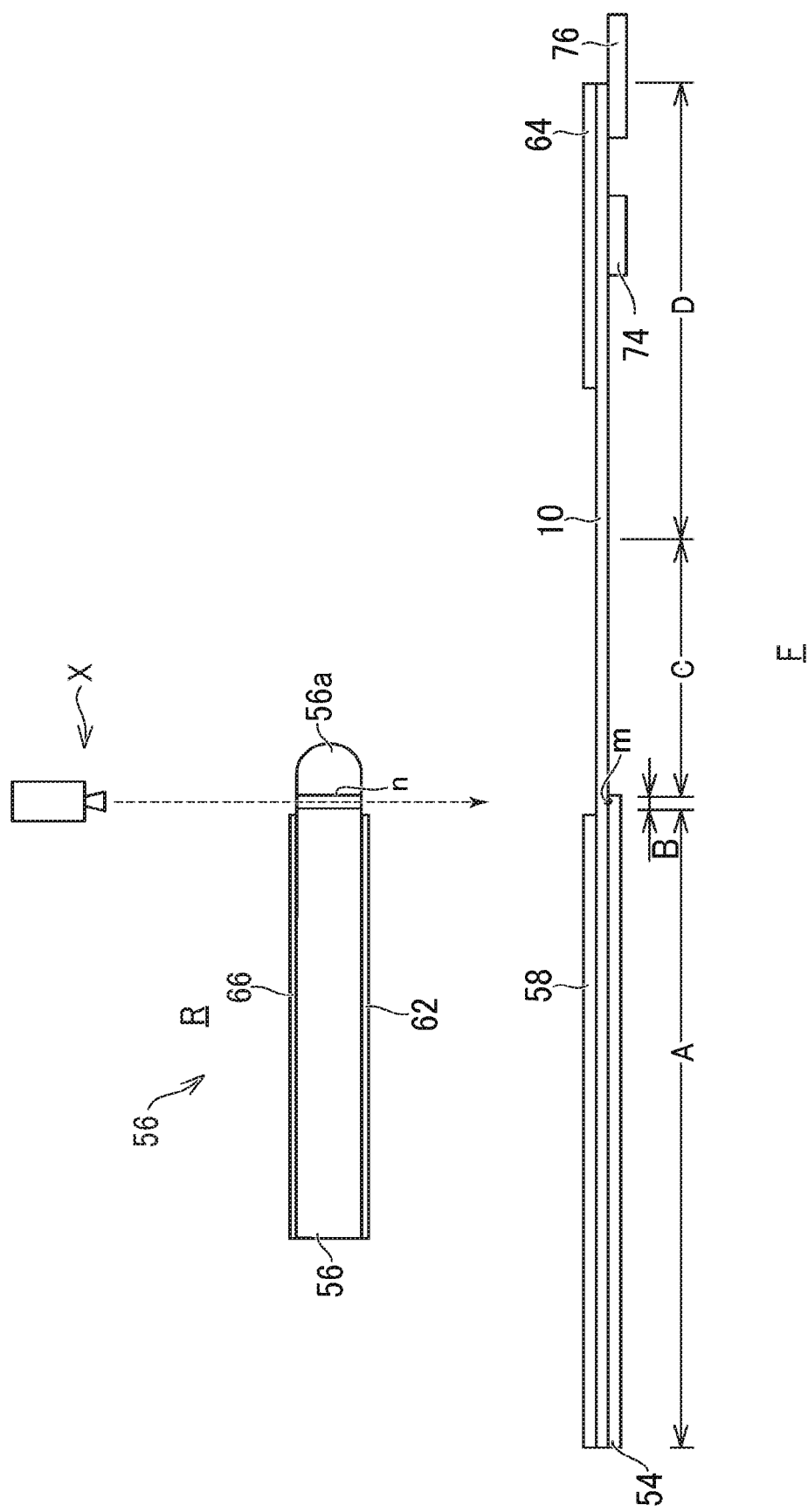
FIG. 6C is a side view of the flexible substrate in a state where the spacer is being positioned on the flexible substrate.
Figure 6D:
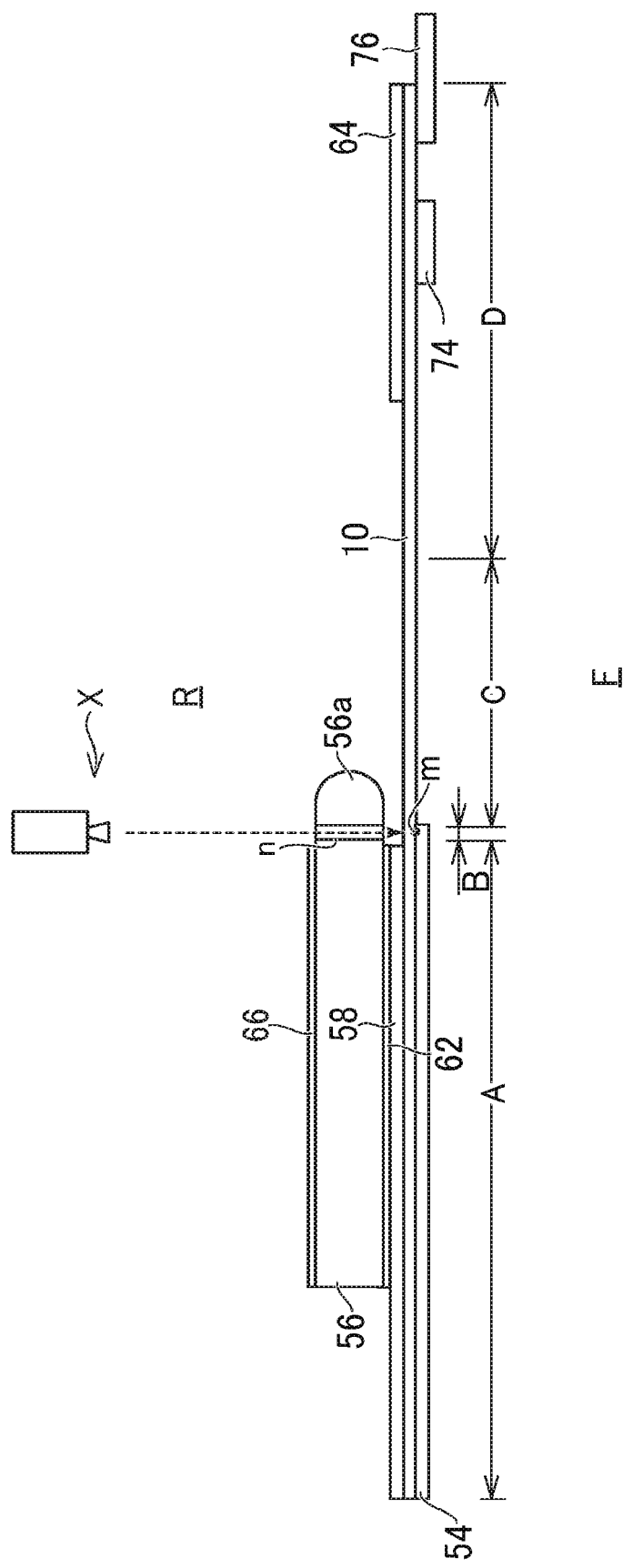
FIG. 6D is a side view of the flexible substrate in a state where the spacer is positioned on the flexible substrate.
Figure 6E:
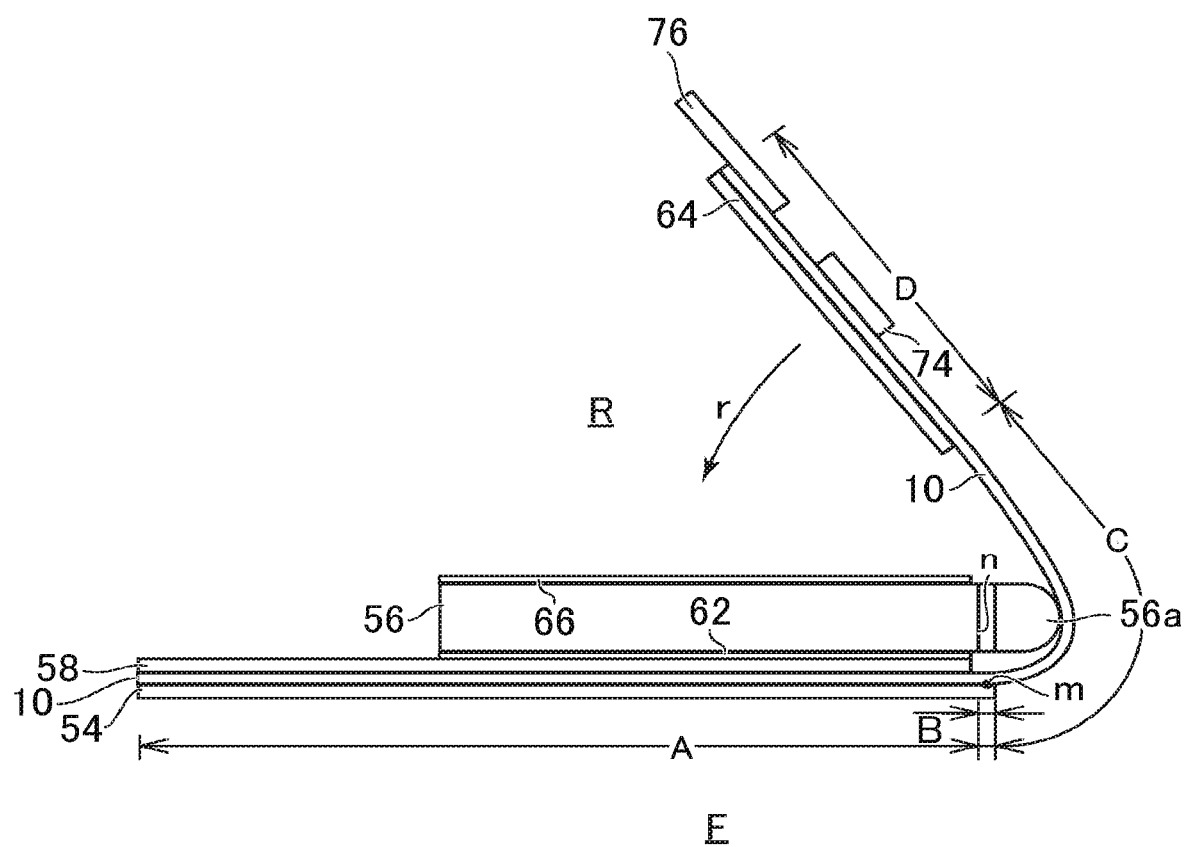
FIG. 6E is a side view of the flexible substrate in a state where the bent area is being curved.

The display device 100 described above can be manufactured by a manufacturing method described below by referring to FIGS. 6A to 6E. FIGS. 6A to 6E are process diagrams for explaining the manufacturing method of the display device 100. FIG. 6A is a side view of the flexible substrate in a developed state. FIG. 6B is a side view of the spacer. FIG. 6C is a side view of the flexible substrate in a state where the spacer is being positioned on the flexible substrate. FIG. 6D is a side view of the flexible substrate in a state where the spacer is positioned on the flexible substrate. FIG. 6E is a side view of the flexible substrate in a state where the bent area is being curved.

First, the flexible substrate 10 in a developed state (pre-bent state) is prepared. The alignment mark m is provided on the display surface side F of the flexible substrate 10 in the frame area B. The integrated circuit chip 74 and the FPC substrate 76 are disposed on the terminal area D of the flexible substrate 10. Further, the surface reinforcing film 54 is provided on the display surface side F in the display area A and the frame area B. The back reinforcing film 58 is provided on the back surface side R in the display area A, and the back reinforcing film 64 is provided on the back surface side R in the terminal area D. The back reinforcing film 58 is provided so as not to overlap the alignment mark m. The above process leads to the state of the flexible substrate 10 shown in FIG. 6A.

The alignment mark m may be any mark that can be detected by an imaging device, such as a camera, or visually checked by a human. For example, the alignment mark m may be formed in the mark "+." Since the flexible substrate 10 is transparent, the alignment mark m is readable from the back surface side R of the flexible substrate 10.

The spacer 56 on which the notches n are provided is prepared. The adhesive member 62 is provided on the display surface side F of the spacer 56, and the adhesive member 66 is provided on the back surface side R. The above process leads to the state of the spacer 56 shown in FIG. 6B.

Subsequently, the spacer 56 is positioned on the flexible substrate 10. Here, an example of positioning the spacer 56 on the flexible substrate 10 using a camera X as an imaging device will be described. First, the spacer 56 is held with the use of a robot arm, for example. In this regard, the spacer 56 can be moved in a stable condition by holding the spacer 56 such that claws of the robot arm are engaged in the pair of notches n provided on the spacer 56.

As shown in FIG. 6C, while the spacer 56 is moved on the flexible substrate 10 placed on a worktable, for example, the spacer 56 is positioned on the flexible substrate 10. In particular, the spacer 56 is moved to a position where the alignment mark m on the flexible substrate 10 is readable when viewed from the back surface side R of the held spacer 56 through the notch n, that is, a position on which the notch n overlaps the alignment mark m. Subsequently, the spacer 56 is positioned on the flexible substrate 10 at the position on which the notch n overlaps the alignment mark m. At this time, the back reinforcing film 58 and the spacer 56 provided on the flexible substrate 10 are adhered to each other by the adhesive member 62. FIG. 6D shows such a condition.

As shown in FIG. 6E, the bent area C of the flexible substrate 10 is bent in the direction of an arrow r. At this time, the bent area C is bent so that the guide section 56a of the spacer 56 is in contact with the bent area C and the bent area C is provided along the guide section 56a. The terminal area D is placed closer to the back surface side R than the spacer 56. At this time, the back reinforcing film 64 is affixed to the adhesive member 66 on the spacer 56, and thus the flexible substrate 10 is maintained to be bent. With the steps described above, the display device 100 appears in a state as shown in FIG. 1.

With the use of the manufacturing method of this embodiment as described above, the spacer 56 can be accurately positioned on the flexible substrate 10. If the spacer 56 is not properly positioned on the flexible substrate 10, the restriction range of the bending is changed (the length of the bent area C of the flexible substrate 10 is changed). This may result in widening or narrowing the width of the frame area B, while the manufacturing method of this embodiment will hardly cause such a problem. In other words, narrowing a frame can be accurately performed.

In this embodiment, the alignment mark m is provided on the display surface side F in the frame area B, although the alignment mark m may be provided on the back surface side R in the frame area B. In this embodiment, by way of example, and not limitation, the notch n is provided on the spacer 56. For example, if the alignment mark m on the flexible substrate 10 is readable when viewed from the back surface side R through the spacer 56, a hole may be formed through from the back surface side R to the display surface side F. In this case, a pair of notches may be additionally formed on the spacer 56 in order to hold the spacer 56 by claws of a robot arm, for example.

In this embodiment, by way of example, and not limitation, the camera X as an imaging device is used to detect the alignment marks m, and the spacer 56 is thereby positioned on the flexible substrate 10. For example, the alignment mark m may be detected by using a laser device. In this embodiment, by way of example, and not limitation, the spacer 56 is held and moved by a robot arm that operates automatically. For example, a person as an operator may hold the spacer 56 using a holding tool, such as tweezers, while viewing the alignment mark m so as to position the spacer 56 on the flexible substrate 10. The alignment mark m may also be formed in the display area A. In this case, the notch n may be formed on the corresponding position. As shown in FIG. 1, the back reinforcing film 58 is not limited to the configurations in which the back reinforcing film 58 does not overlap the alignment mark m and the notch n, but may be any configurations if the alignment mark m can be detected through the notch n. For example, the back reinforcing film 58 may have a hole at a position on which the back reinforcing film 58 overlaps the notch n and the alignment mark m. Further, for example, the back reinforcing film 58 may be made of a transparent material so that the alignment mark m can be detected through the back reinforcing film 58 at the position on which the back reinforcing film 58 overlaps the notch n and the alignment mark m.

Figure 7:
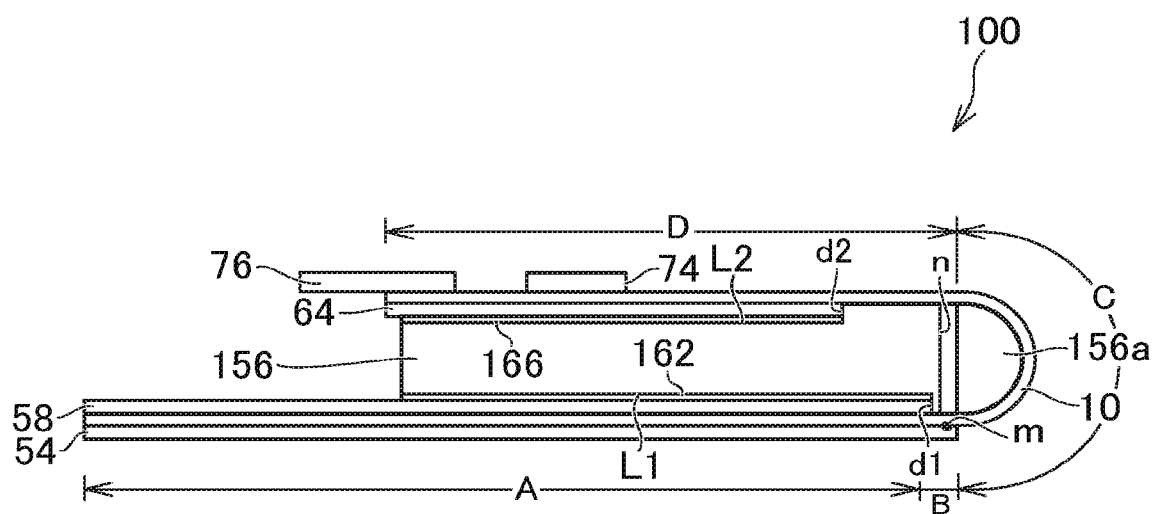
FIG. 7 is a side view of the display device illustrating an overall configuration of the display device according to the variation.

Next, referring to FIG. 7, a variation of this embodiment will be described. FIG. 7 is a side view of the display device illustrating an overall configuration of the display device. In the variation, the description regarding the configuration is the same as that of the embodiment other than the shape of the spacer, and thus common elements are labeled with the same reference numerals and their overlapping explanation will be omitted.

As shown in FIG. 7, a spacer 156 has steps on a display surface side F and a back surface side R, respectively. The spacer 156 has a first bottom surface L1, which is more recessed than other areas because of a first step d1 being formed on the display surface side F, and a second bottom surface L2, which is more recessed than other areas because of the second step d2 being formed on the back surface side R.

The first bottom surface L1 is provided with an adhesive member 162. The first bottom surface L1 is adhered to a back reinforcing film 58, which is provided on the back surface side R of the flexible substrate 10 in a display area A, through an adhesive member 162.

The second bottom surface L2 is provided with an adhesive member 166. The second bottom surface L2 is adhered to a back reinforcing film 64, which is provided on the display surface side F of the flexible substrate 10 in the terminal area D, through an adhesive member 166.

The height of the first step d1 formed on the display surface side F may be substantially the same as the combined thickness of the adhesive member 162 and the back reinforcing film 58. Such a configuration allows the flexible substrate 10 to be bent along the spacer 156 without leaving space. Similarly, the height of the second step d2 formed on the back surface side R may be substantially the same as the combined thickness of the adhesive member 166 and the back reinforcing film 64.

In the variation, the spacer 156 also needs to be accurately positioned on the flexible substrate 10. Specifically, in the variation, if the spacer 156 is not accurately positioned on the flexible substrate 10, it is expected that the back reinforcing film 58 interferes with the first step d1.

As such, similarly to the spacer 56 described above, the spacer 156 includes a notch n penetrating from the back surface side R to the display surface side F. The notch n is formed closer to a guide section 156a than the first step d1 and the second step d2. When the spacer 156 is positioned on the flexible substrate 10, positioning is performed while reading the alignment mark m on the flexible substrate 10 through the notch n, and thus it is possible to accurately position the spacer 156.

Note that the back reinforcing film 58 described in this embodiment and the variation corresponds to a first reinforcing film of the present invention, and the back reinforcing film 64 corresponds to a second reinforcing film of the present invention. While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
 a spacer; and
 a flexible substrate that includes a display area for displaying an image, a frame area in a periphery of the display area, a bent area disposed outside the frame area and curved to conform to a shape of the spacer, and a terminal area disposed on a back surface side of the spacer through the bent area and provided with a terminal, wherein
 the flexible substrate includes an alignment mark, and
 the spacer includes a notch or a hole at a position corresponding to the alignment mark, the notch or the hole penetrating from the back surface side to a display surface side of the spacer, wherein
 a first reinforcing film is arranged between the back surface side and the flexible substrate,
 a second reinforcing film is arranged between the display surface side and the flexible substrate,
 the display area, the second reinforcing film, the spacer, the first reinforcing film, and the terminal area are arranged in this order in a cross sectional view,
 the notch or the hole has a first portion at the back surface side and a second portion at the display surface side,
 the notch or the hole and the alignment mark are arranged outside of the first reinforcing film and the second reinforcing film in a plan view of peripheries of the bent area of the flexible substrate such that the notch or the hole is aligned with the alignment mark in a folded state of the flexible substrate, and
 the alignment mark, the first portion, and the second portion are aligned with one another in a plan view.

2. The display device according to claim 1, wherein
 a first bottom surface is provided on the display surface side of the spacer, the first bottom surface being formed because of a first step being formed, and
 the first reinforcing film that is disposed on the first bottom surface is provided on the back surface side of the flexible substrate.

3. The display device according to claim 2, wherein
 a second bottom surface is provided on the back surface side of the spacer, the second bottom surface being formed because of a second step being formed, and
 the second reinforcing film that is disposed on the second bottom surface is provided on the display surface side of the flexible substrate.

4. The display device according to claim 3, wherein
 the spacer includes a guide section in contact with the bent area, and
 the notch or the hole is provided closer to the guide section than the first step and the second step.

5. The display device according to claim 1, wherein
 the alignment mark is formed in the frame area.

* * * * *